(12) United States Patent
Powell

(10) Patent No.: US 6,383,926 B2
(45) Date of Patent: May 7, 2002

(54) METHOD OF MANUFACTURING A TRANSISTOR

(75) Inventor: Martin J. Powell, Horley (GB)

(73) Assignee: U. S. Philips Corporation, New York, NY (US)

( * ) Notice: Subject to any disclaimer, the term of this patent is extended or adjusted under 35 U.S.C. 154(b) by 0 days.

(21) Appl. No.: 09/734,771

(22) Filed: Dec. 12, 2000

(30) Foreign Application Priority Data

Dec. 15, 1999 (GB) .............................................. 9929614

(51) Int. Cl.⁷ .............................................. H01L 21/44

(52) U.S. Cl. ..................................................... 438/678

(58) Field of Search .......................... 257/40; 349/126; 438/678, 625

(56) References Cited

U.S. PATENT DOCUMENTS 5,796,458 A * 8/1998 Koike .......................... 349/126
6,150,668 A * 11/2000 Bao ............................. 257/40

FOREIGN PATENT DOCUMENTS

JP           60133758        7/1985
JP           60159825        8/1985

* cited by examiner

*Primary Examiner*—Charles Bowers
*Assistant Examiner*—Andre' C Stevenson
(74) *Attorney, Agent, or Firm*—Aaron Waxler

(57) ABSTRACT

A method of manufacturing a thin film transistor (TFT) is disclosed comprising source and drain electrodes joined by a semiconductor channel layer, a gate insulating layer formed from at least two sublayers and a gate electrode. The method comprising the steps of forming the gate insulating layer by depositing a thin film sublayer using a thin film technique; and depositing a printed sublayer by printing, wherein the thin film sublayer is located adjacent the semiconductor channel layer. The TFT may be a top gate TFT wherein the thin film sublayer is formed on the semiconductor channel layer, and wherein the printed sublayer is formed over the thin film sublayer. Alternatively, the TFT may be a bottom gate TFT wherein the printed sublayer is formed over the gate electrode; wherein the thin film sublayer is formed over the printed sublayer, and wherein the semiconductor channel layer is formed on the thin film sublayer.

11 Claims, 5 Drawing Sheets

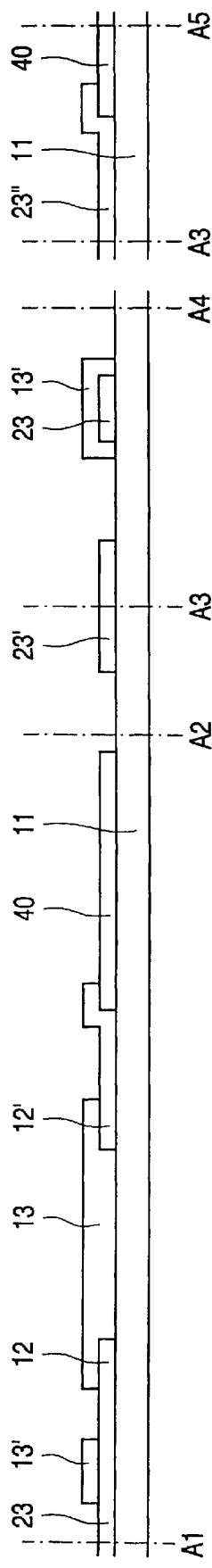
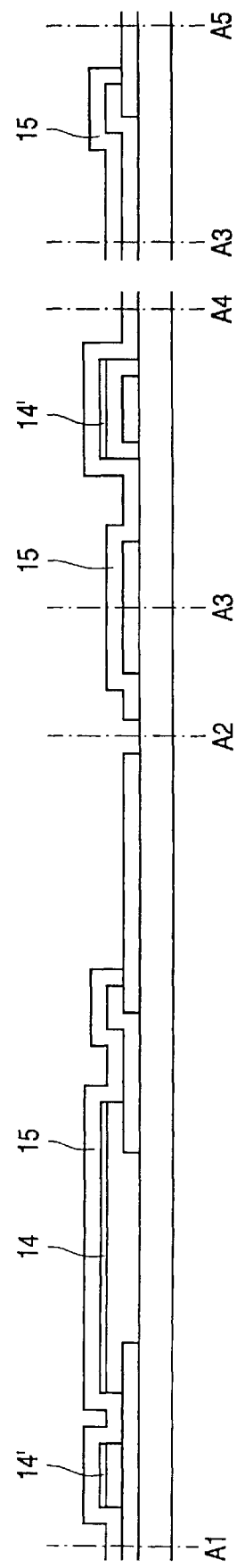
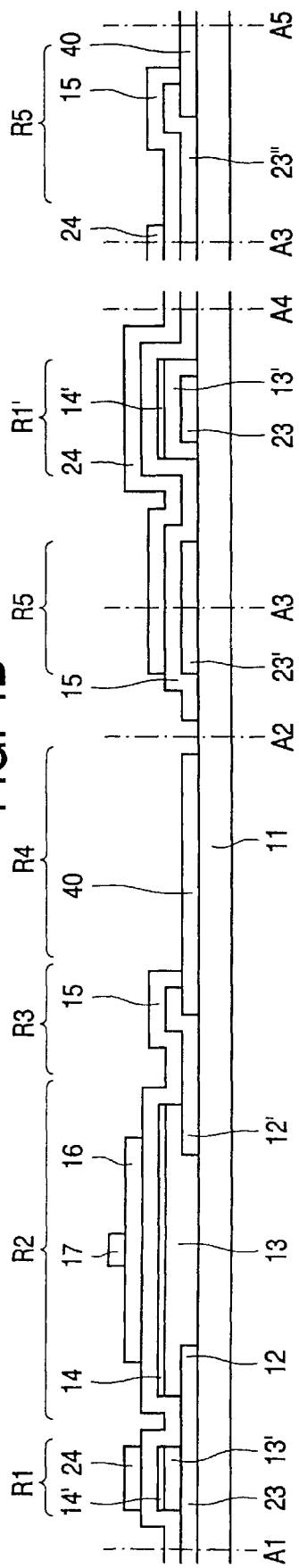
FIG. 4A
FIG. 4B
FIG. 4C

METHOD OF MANUFACTURING A TRANSISTOR

This invention relates to a method of manufacturing a transistor using hybrid thin and thick film techniques and to a transistor manufactured using the same.

The invention further relates to an active matrix device, especially an active matrix liquid crystal display (AMLCD), comprising a row and column array of active elements wherein each element is associated with such a transistor and connected to corresponding row and column conductors.

For the avoidance of doubt, the abbreviation TFT is used hereafter to denote a thin film transistor in which at last one part of the transistor is manufactured using a thin film technique, i.e. by a method such as chemical or physical vapour deposition, or electrolysis, and so TFT includes a transistor made by a hybrid method using both thin film and thick film deposition.

From JP-A-60-133758, it is known to manufacture a TFT using hybrid thin and thick film methods and, in particular, to print source, gate and drain electrodes having formed the body of the TFT, the semiconductor and insulating layer, by conventional thin film techniques. Similarly, from JP-A-04-136917, it is known to manufacture an active matrix device comprising a row and column array of such TFTs and furthermore to print the row and column conductors. In addition, from JP-A 60-159825, it is known to provide a TFT with a printed, silica insulating layer.

As is well known, the gate insulating layer of a TFT is required to be of sufficient thickness so as to prevent electrical breakdown between the gate electrode and the semiconductor layer. However, manufacturing an insulating layer of sufficient thickness using thin film techniques such a CVD can be time consuming and therefore expensive. The alternative of thick film printing of the insulating layer is quicker and cheaper that using a thin film technique, but provides an insulating layer with a low integrity interface with the semiconductor layer. This can lead to a high density of defect states thus providing a TFT with high pre-threshold slope transfer characteristics and a low mobility.

It is an object of the invention to provide an enhanced method of manufacturing a TFT using hybrid thin and thick film manufacturing techniques, and to provide a TFT manufactured using the same. It is a further object of the invention to provide an active matrix device, especially for an AMLCD, comprising an array of such TFTs.

According to the present invention, there is provided a method of manufacturing a TFT comprising source and drain electrodes joined by a semiconductor channel layer, a gate insulating layer formed from at least two sublayers and a gate electrode. The method comprises the steps of forming the gate insulating layer by depositing a thin film sublayer using a thin film technique; and depositing a printed sublayer by printing, wherein the thin film sublayer is located adjacent the semiconductor channel layer.

Such a method provides a TFT with a gate insulator with a high integrity semiconductor interface as one would normally associate with thin film manufacture, whilst enjoying the advantages of thick film manufacture with respect to time and cost.

The method of the present invention can be used to manufacture a top gate (TG) TFT by depositing the thin film sublayer on the semiconductor channel layer and the printed sublayer over the thin film sublayer. Alternatively, the method of the present invention can be used to manufacture a bottom gate (BG) TFT by printing the printed sublayer over the gate electrode, depositing the thin film sublayer over the printed sublayer, and forming the semiconductor layer on the thin film sublayer.

In a TG TFT, the thin film sublayer is preferably inorganic, e.g. silicon nitride, and the printed sublayer organic, e.g. polyimide. This enhances the overall process compatibility with respect to temperature given that the inorganic thin film sublayer is deposited using a typically high temperature thin film technique such as chemical vapour deposition (CVD) and the organic, printed sublayer is printed after, using a lower temperature direct printing process. I.e. a decreasing temperature profile.

The manufacture of a TG TFT is further enhanced when the gate electrode is also formed by a printing process. Similarly, in a coplanar TG TFT, the source, gate and drain electrodes may each be formed by printing, and preferably, in the same printing step.

In a BG TFT, for the same reasons of process compatibility described above, both the thin film and printed sublayers are preferably inorganic. For example, the printed sublayer may comprise sol gel or cermet (tantalum oxide). Normally, an inorganic printed sublayer will be more stable when exposed to high temperatures associated with CVD deposition of the thin film sublayer than an organic material such as polyimide. In an staggered BG TFT, the source and drain electrodes may be printed, being a final low temperature process step.

In order to reduce the mask count during the manufacture of both TG and BG TFTs according to the present invention, the thin film sublayer deposited by CVD and the semiconductor layer may be patterned at the same time, e.g. by etching.

Further provided in accordance with the present invention is an active matrix device, especially an AMLCD, comprising a row and column array of active elements wherein each element is associated with a TFT according to the present invention, and connected to corresponding row and column conductors.

Embodiments of the present invention will now be described, by way of example only, with reference to the following drawings in which:

FIGS. 4A to 4C illustrate, schematically, a method of manufacturing the picture element of FIG. 3.

Figure 1A:
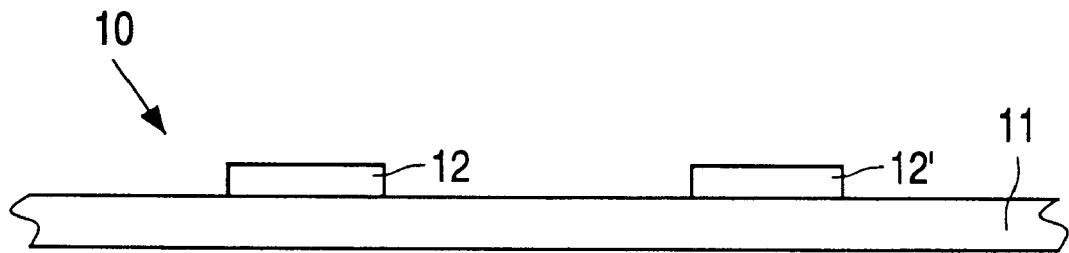
FIGS. 1A to 1D illustrate a method of manufacturing a TG TFT according to the present invention.
Figure 1B:
Figure 1C:
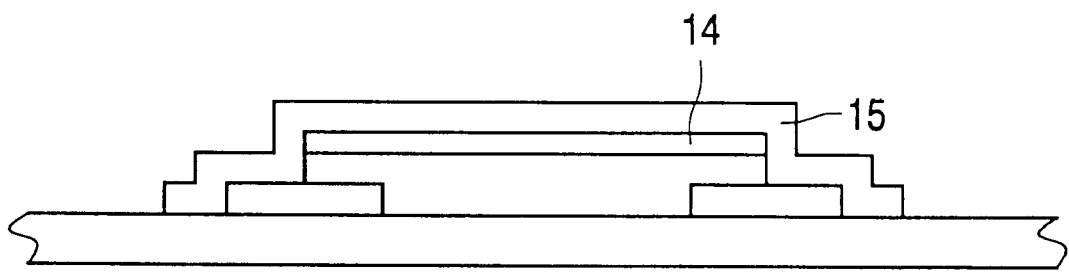
Figure 1D:
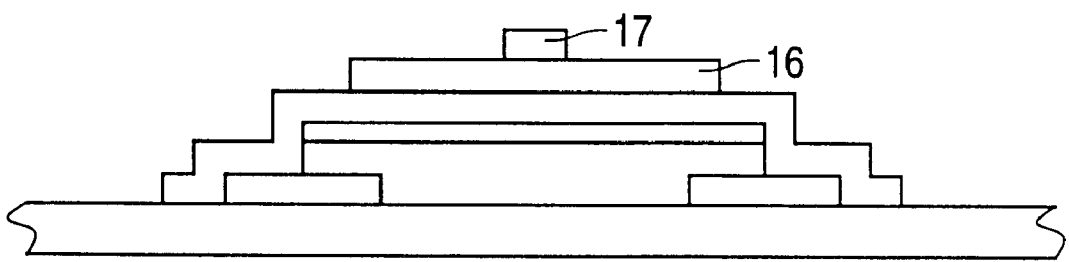

It should be noted that the drawings are schematic and relative dimensions and proportions of parts of the cross-section views and circuit layout have been exaggerated or reduced in size for the sake of clarity. The same reference signs are generally used to refer to corresponding or similar features in different embodiments.

FIGS. 1A to 1D illustrate a method of producing a self-aligned TG TFT 10 requiring 4 photomask steps and a single back exposure, and in accordance with the present invention. The method comprises the steps of forming opaque metal source 12 and drain 12' electrodes on a transparent substrate 11 (mask 1); forming an amorphous silicon semiconductor channel 13 so as to join the source and drain electrodes and a thin film gate insulating sublayer 14 of silicon nitride deposited thereon using a chemical vapour deposition (CVD) technique (mask 2); printing an inorganic, further gate insulating sublayer 15 on the thin film sublayer (mask 3); depositing a layer of transparent conductive gate material, typically indium tin oxide (ITO), and patterning the material by back exposure so as to form the gate electrode 16 with source/drain overlap; and forming a metal row conductor contact 17 (mask 4).

The transparent gate material may be patterned by providing a negative resist layer (not shown) over the material and selectively exposing it to UV radiation from beneath the substrate 11. The source and drain electrodes 12, 12' shield the UV light, so that the passage of light through the transistor structure only takes place in the spacing between the source and drain electrodes. The UV light diffracts and scatters as it passes through this opening, and results in source/drain overlap wherein the exposed region of the resist layer is wider than the spacing between the source and drain electrodes. Source/drain overlap is useful in that the gate electrode may then modulate the whole of the semiconductor channel area.

Figure 2:
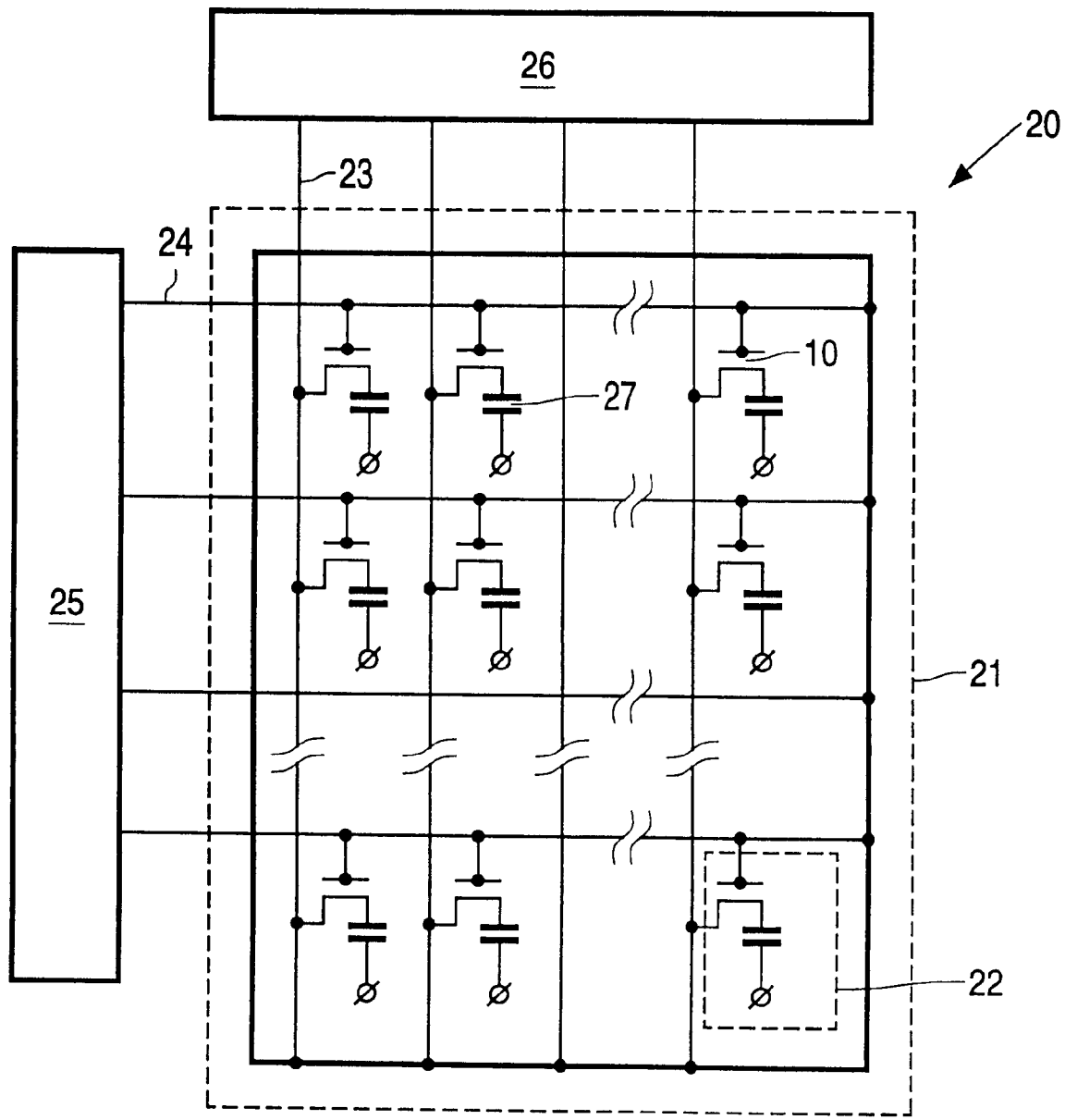
FIG. 2 shows, schematically, a AMLCD incorporating TFTs manufactured by the method illustrated in FIGS. 1A to 1D.

Referring to FIG. 2, an AMLCD is shown, schematically, incorporating TFTs manufactured by the method illustrated in FIGS. 1A to 1D. The AMLCD 120 comprises an display area 21 consisting of m rows (1 to m) and n columns (1 to n) of identical picture elements 22. Only a few of the picture elements are shown for simplicity whereas in practice, the total number of picture elements (m×n) in the display area may be 200,000 or more. Each picture element 22 has a picture electrode 27 and associated therewith a switching TFT 10 of the type manufactured by the method illustrated in FIGS. 1A to 1D, and which serves to control the application of data signal voltages to the picture electrode. The switching TFTs have common operational characteristics and are each arranged adjacent to their associated picture element with their respective drain being connected to the picture electrode. The sources of all switching TFTs associated with one column of picture elements are connected to a respective one of a set of parallel column conductors 23 and the gates of all switching TFTs associated with one row of picture elements are connected to a respective one of a set of parallel row conductors 24. The TFTs are controlled by gating signals provided via the row conductors by row driver circuitry 25 external to the display area 21. Similarly, the TFTs associated with picture elements in the same column are provided with data signal voltages for the picture electrodes by column driver circuitry 26 also external to the display panel. Of course, the operation of picture elements in such AMLCDs is well known and accordingly will not be elaborated upon here further.

Figure 3:
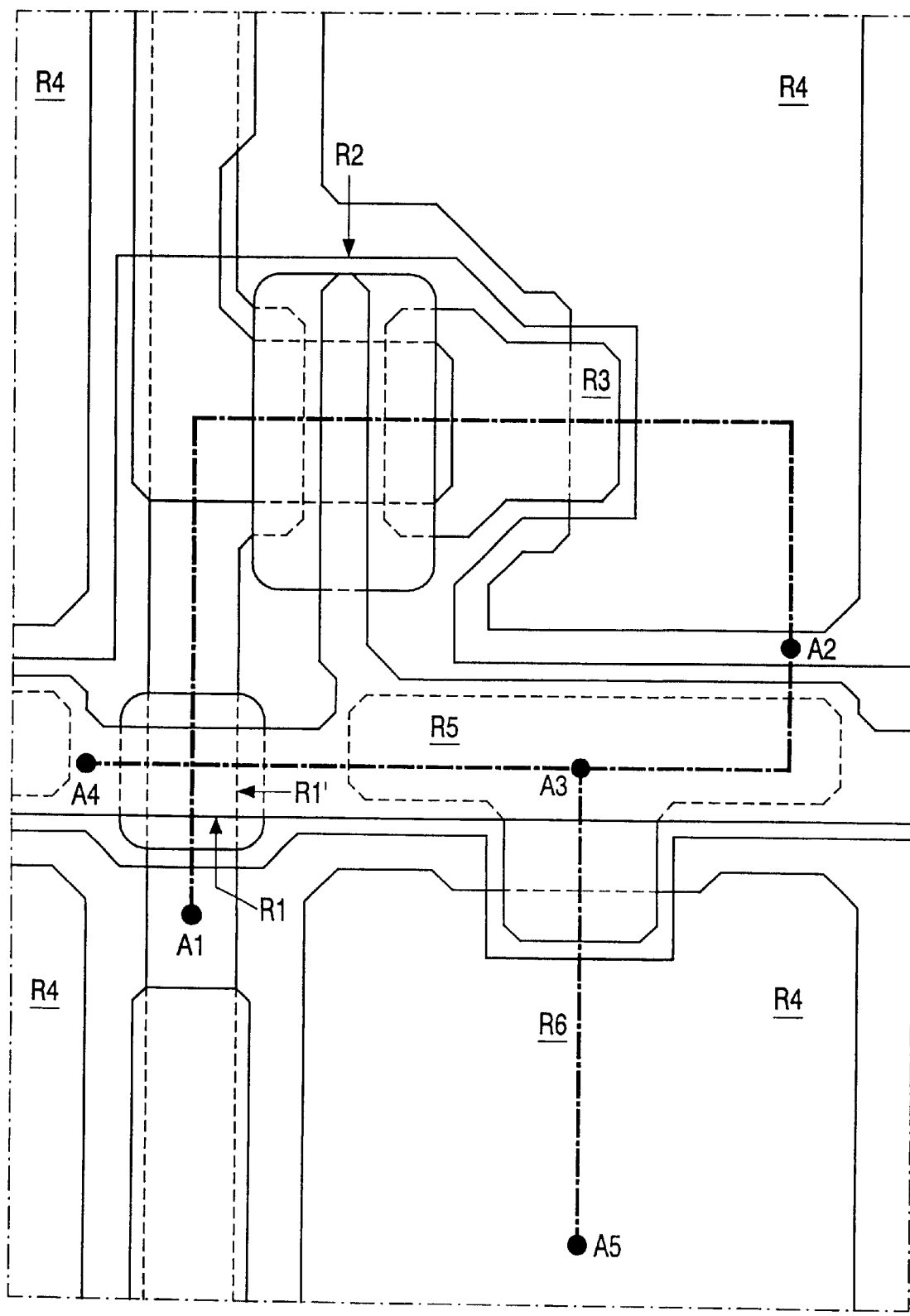
FIG. 3 shows, schematically, a picture element of the AMLCD of FIG. 2 in greater detail.

Referring both to FIG. 3 which shows, schematically, a picture element 22 of the AMLCD of FIG. 2 in greater detail and FIG. 4C which is a cross-section along lines A1-A2-A3-A4 and A3-A5 shown in FIG. 3, the picture element comprises 6 distinct regions: a conductor crossover (R1 and R1' in respective directions); a self-aligned TG TFT manufactured by the method illustrated in FIGS. 1A to 1D (R2); a first transparent pixel electrode contact (R3); a transparent pixel electrode (R4); a capacitor (R5); and a second transparent pixel electrode contact (R6).

The conductor crossover (R1, R1') comprises a column conductor 23 formed on an insulating substrate 11. A row conductor 24 is laid over the column conductor 23 electrically separated therefrom by an amorphous silicon 13' layer, a thin film insulating layer 14' and a printed insulating layer 15.

The TG TFT (R2) is in a staggered arrangement and comprises opaque, metal source 12 and drain 12' electrodes, joining which is an amorphous silicon channel 13. Over the amorphous silicon channel, is a gate insulator 14, 15 comprising a thin film insulating sublayer 14 and a printed insulating sub layer 15, printed on the thin film insulating sublayer. The gate electrode 16 consists of ITO and, with some source/drain overlap, is self aligned with respect to the source and drain electrodes.

The pixel electrode 40 (R4) comprises ITO and is formed on the insulating substrate 11. Contacts R3, R6 provide a electrical supply to the pixel electrode from the drain electrode 12' and to a parallel plate capacitor (R5) respectively. The capacitor has a bottom plate 23' of the same material as the column conductor 23 and the source 12 and drain 12' electrodes which are deposited at the same time, a dielectric layer formed from the printed insulating sublayer 15, and a top plate formed as part of the gate row conductor 24.

With regard to the manufacture of the picture element 22, as shown in FIG. 4A, an ITO pixel electrode 40 is first formed on the glass substrate 11. Then, opaque source 12 and drain electrodes 12' are formed, together with column conductors 23, part of which act a capacitor plate 23' (mask 1). An amorphous silicon semiconductor channel 13 is then formed so as to join the source and drain electrodes, and also extends 13' from the channel along parts of the column conductor 23.

Referring to FIG. 4B, over the amorphous silicon channel, a gate insulator 14, 15 is formed by depositing a thin film insulating sublayer 14 of silicon nitride deposited using CVD and a printed insulating layer 15 of polyimide, printed on the thin film insulating layer. Both sublayers of the gate insulator are used as crossover (R1, R1') insulating layers and the printed insulating layer 15 is used alone as the capacitor dielectric (R5) (mask 3). An ITO gate electrode 16 is formed by a back exposure of a negative resist, and conventional masking is used to form the transparent pixel electrode (mask 4); Lastly, a gate contact 17 connected to a metal row conductor 24 are formed as shown in FIG. 4C (mask 5).

Figure 5A:
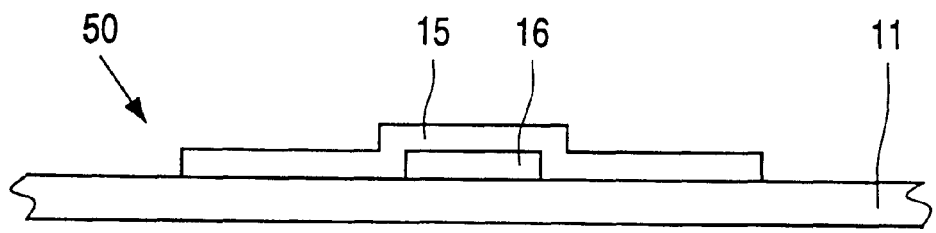
FIGS. 5A to 5D illustrate a method of manufacturing a BG TFT according to the present invention.
Figure 5B:
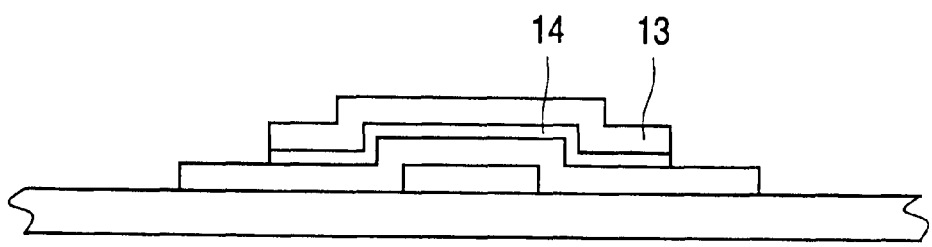
Figure 5C:
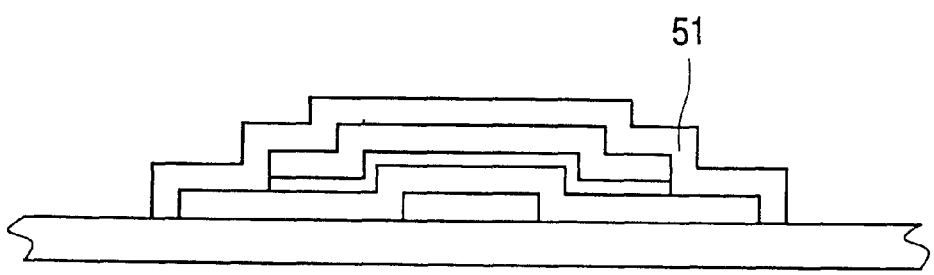
Figure 5D:
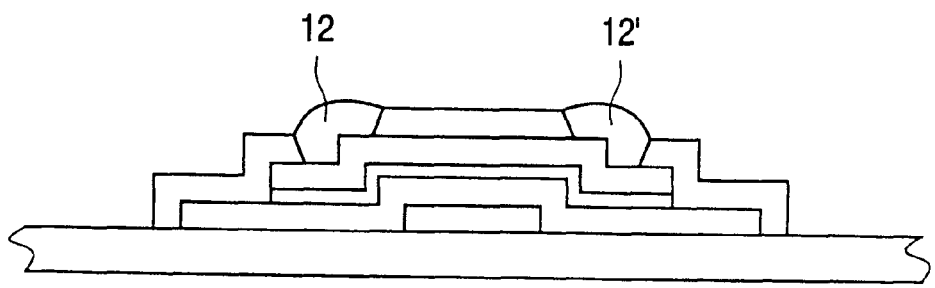

As an alternative to the TG TFT, FIGS. 5A to 5D illustrate a method of producing a self-aligned BG TFT 50 in accordance with the present invention. Referring to FIG. 5A, the method comprises the steps of depositing by CVD a metal gate electrode 16 on a transparent substrate 11 (mask 1) and printing a cermet gate insulating sublayer 15 (mask 2). As shown in FIG. 5B, a silicon dioxide insulating sublayer 14 is deposited by CVD followed by an amorphous silicon semiconductor channel 13 so as to join source 12 and drain electrodes (mask 3). Referring to FIGS. 5C and 5C, a protective insulating layer 51 is formed and contact holes etched in the protective layer so as to provide for source 12 and drain 12' electrodes (mask 4).

In the embodiments described, the semiconductor layer, the source and drain electrodes and the column conductors may be deposited by any appropriate conventional technique such as sputtering, chemical vapour deposition, or thermal evaporation etc. Patterning by masking using photolithographic techniques with resist layers is of course well known and, similarly, negative photoresists are also known.

Also, where the semiconductor layer comprises amorphous silicon, it may be desirable that additional processing steps are carried out to improve the contact resistance between the metal layers of the source and drain 12, 12' and the silicon layer 13. For this purpose, flash doping of phosphine ions into the structure may be carried out, so that the implanted phosphine ions subsequently migrate into the amorphous silicon layer to form a doped surface region at the point of contact between the amorphous silicon layer and the source and drain contacts. This technique will be known to those skilled in the art.

The semiconductor layer 13 may alternatively comprise microcrystalline silicon, which gives rise to a higher mobility device without introducing significant additional processing complexity. The use of microcrystalline silicon is particularly advantageous in a top gate structure, as the quality of the silicon layer improves as the layer is deposited, so that a higher quality layer is present in the region of the gate of the transistor. As a further alternative, a polycrystalline silicon layer may be formed, for example by depositing an amorphous silicon layer and performing a subsequent laser annealing process.

In this description, and the claims, the reference to a "transparent" layer indeed indicates the transparency of the layer to the radiation selected for exposure of a negative resist layer. The layers forming the structure of the transistor will, of course, not be 100% transparent, but they will result in some absorption and reflection of the radiation signal. The term "transparent" is therefore intended to indicate only that the layers of the structure are sufficiently transparent to enable the selective exposure of the negative resist layer enable the correct use of the photoresist for subsequent processing of the structure. In any case, the invention not limited to a TFT of the self aligned type.

Also, the active matrix device described above is incorporated into an AMLCD, however, it will be appreciated that the invention has application with respect to active matrix devices for other types of electronic devices such as thin film data stores or image sensors.

The specific considerations for the practical manufacture of both thin film and thick film transistors will be apparent to those skilled in the art, and the considerations which should be applied for existing transistor designs should also be applied for design of a transistor in accordance with the invention. The precise process conditions which may be appropriate have not been described in this text, as this is a matter of normal design procedure for those skilled in the art.

What is claimed is:

1. A method of manufacturing a thin film transistor (TFT) comprising source and drain electrodes joined by a semiconductor channel layer, a gate insulating layer formed from at least two sublayers and a gate electrode, the method comprising the steps of forming the gate insulating layer by:
   depositing a thin film sublayer using a thin film technique; and
   depositing a printed sublayer by printing,
wherein the thin film sublayer is located adjacent the semiconductor channel layer.

2. A method according to claim 1 wherein the TFT is a top gate TFT; wherein the thin film sublayer is deposited on the semiconductor channel layer; and wherein the printed sublayer is printed over the thin film sublayer.

3. A method according to claim 2 wherein the thin film sublayer is inorganic and the printed sublayer is organic.

4. A method according to claim 2 wherein the gate electrode is formed by printing.

5. A method according to claim 4 wherein the TFT is of the coplanar type, and wherein the gate, source and drain electrodes are each formed by printing.

6. A method according to claim 5 wherein the gate, source and drain electrodes are formed in the same printing step.

7. A method according to claim 1 wherein the TFT is a bottom gate TFT; wherein the printed sublayer is printed over the gate electrode; wherein the thin film sublayer is deposited over the printed sublayer; and wherein the semiconductor channel layer is formed on the thin film sublayer.

8. A method according to claim 7 wherein both the thin film and printed sublayers are inorganic.

9. A method according to claim 7 wherein the TFT is of the staggered type, and wherein source and drain electrodes are each formed by printing.

10. A method according to claim 1 wherein the thin film sublayer and the semiconductor layer are patterned at the same time.

11. A method according to claim 10 wherein the thin film sublayer and the semiconductor layer are patterned by etching.

* * * * *

UNITED STATES PATENT AND TRADEMARK OFFICE
CERTIFICATE OF CORRECTION

PATENT NO.   : 6,283,926 B1  
DATED        : September 4, 2001  
INVENTOR(S)  : David D. Cunningham et al.

It is certified that error appears in the above-identified patent and that said Letters Patent is hereby corrected as shown below:

<u>Column 15,</u>  
Line 46, replace "said method comprising the steps of" with -- said method comprising the steps of: --.

Signed and Sealed this

Seventh Day of May, 2002

*Attest:*

*Attesting Officer*

JAMES E. ROGAN  
*Director of the United States Patent and Trademark Office*